United States Patent [19]

Meguro et al.

[11] Patent Number: 5,287,074
[45] Date of Patent: Feb. 15, 1994

[54] ELECTRIC PARTS FOR SHIELDING ELECTROMAGNETIC NOISE

[75] Inventors: Toshiaki Meguro; Katuhiko Nishikawa; Yasuhito Maeshima, all of Aichi, Japan

[73] Assignee: Sony Corporation, Tokyo, Japan

[21] Appl. No.: 914,815

[22] Filed: Jul. 15, 1992

[30] Foreign Application Priority Data

Jul. 20, 1991 [JP] Japan .............................. 3-203166

[51] Int. Cl.$^5$ ............................................. H03H 7/01
[52] U.S. Cl. .................................... 333/12; 333/185;
333/181; 336/92; 336/175
[58] Field of Search ............... 333/12, 24.2, 181, 185;
336/175–177, 90, 92; 174/32, 36

[56] References Cited

U.S. PATENT DOCUMENTS

| | | | |
|---|---|---|---|
| 4,146,854 | 3/1979 | Ishino et al. | 333/181 X |
| 4,656,451 | 4/1987 | Pomponio | 333/12 X |
| 4,972,167 | 11/1990 | Fujioka | 333/12 X |

*Primary Examiner*—Paul Gensler
*Attorney, Agent, or Firm*—Jerry A. Miller; Pasquale Musacchio

[57] ABSTRACT

An apparatus for providing electromagnetic shielding. A wire for carrying an electrical signal is shielded with a first cylindrical ferrite shield by passing the wire through its central passage. The first ferrite shield has magnetic characteristics which provide attenuation of electrical noise over a first particular frequency band. A second cylindrical ferrite shield is situated adjacent the first shield with the wire passing through its central passage. The second ferrite shield has magnetic characteristics which provide attenuation of electrical noise over a second particular frequency band. A plastic package surrounds the first and second ferrite shields, and holds the first and second shields end to end in fixed proximity to one another. The plastic package includes a pair of half-cylindrical package sections having a joined edge and two open edges with a hinge portion joining the pair of package sections at the joined edge. A pair of latches, each including a hole, are situated at one of the open edges. A pair of recessed portions with hooks are aligned with the latches and engage the latches when the half-cylindrical sections are rotated to a closed position to form the cylindrical shape. A plurality of projections are situated at the open ends of the package sections and adjacent an end of each of the first and second ferrite shields. These projections project toward a central area of the package when in the closed position to retain the first and second half-cylindrical portions of the first and second ferrite shields within the plastic package.

20 Claims, 3 Drawing Sheets

ELECTRIC PARTS FOR SHIELDING ELECTROMAGNETIC NOISE

BACKGROUND

1. Field of the Invention

The present invention relates to electric parts for shielding noise generated on a signal line in various electronic equipment such as a computer.

2. Background of the Invention

Electromagnetic noise escaping from the cabinet and signal lines of electronic equipment causes a problem. Since these noises can be close to the control signal level, they can cause electromagnetic interference (EMI). This can lead to malfunctions or partial deletion of magnetic information recordings. A shielding structure to absorb noises is known in which a tubular ferrite core is mounted around a signal line. FIG. 5 is an example of such a conventional shielding structure.

In FIG. 5, the shielding parts 62 include a single magnetic element 63 such as a ferrite core and a plastic package 64 mounted surrounding the outer surface of the magnetic element 63. Because this shielding structure includes the single magnetic element 63 inside the package 64, the frequency band of noise to be absorbed is limited to a relatively narrow frequency band that can be absorbed by the single magnetic element 63. Therefore, other methods have been utilized to expand the frequency band of noise to be absorbed so that the required attenuation can be obtained. For example, a plurality of shielding parts 62 can be mounted on the signal line 61. Identical shielding parts 62 may be used or parts having different magnetic characteristics of magnetic substance 63 can be used to make up this plurality of shielding parts 62.

FIG. 6 shows the relationship between the frequency and noise attenuation when a plurality of the identical shielding parts 62 are mounted on the signal line 61. FIG. 7 shows the same relationship when a plurality of the shielding parts are used, in which different characteristics of magnetic element 63 are used. FIG. 6 was prepared based upon measured values. The curve represented by (c) shows the characteristics when only one shielding part 62 is utilized. The curve (d) shows the result of using two shielding parts 62 with the same magnetic element 63. On the other hand, the curve (e) in FIG. 7, which was also based upon measured values, shows the relationship between the frequency and noise attenuation when two shielding parts 62 are used. In this curve, each part 62 has a single magnetic element 63 inside the package 64, but with differing magnetic characteristics. As shown in FIG. 6, the effect of noise absorption has been dramatically improved but only in a certain narrow frequency band. Frequencies outside of this certain band are not effectively attenuated. Therefore, the enhanced attenuation is not obtained over a broader frequency band.

On the other hand, as shown in FIG. 7, enhanced attenuation can be obtained over a relatively wide frequency band when the two shielding parts 62 with a different characteristic of a magnetic element 63 are used. However, the above conventional noise shielding structure requires a plurality of shielding parts be independently mounted to make the frequency band for noise absorption wider. Due to the increase of assembling steps, manufacturing cost becomes higher resulting in an increased product price (particularly if the parts are installed manually). Further, as a plurality of the noise shielding parts 62 are independently assembled, precise positioning during an assembly cannot be assured. This invites inconsistency in the quality of the product.

SUMMARY OF THE INVENTION

It is, therefore, an object of the present invention to provide electric parts for shielding electromagnetic noise, which resolve the above mentioned problems.

It is another object of the present invention to provide electric parts for shielding electromagnetic noise, which can obtain a consistent noise shielding effect in the wider frequency band.

It is also another object of the present invention to provide electric parts for shielding electromagnetic noise requiring decreased assembly steps to reduce manufacturing cost.

In one aspect of the present invention, electric parts are arranged with a signal line inserted through their approximate center for shielding electromagnetic noise. The part includes at least two magnetic elements which preferably have respective characteristic to attenuate noise in different frequency bands. A common package is provided for housing a plurality of magnetic elements. Each of the magnetic elements are arranged in series surrounding the signal line inside the common package.

In accordance with the present invention, a plurality of magnetic elements can absorb noise in a broader frequency band. Also, without independently mounting a plurality of magnetic elements, the common package can handle them at once so that the assembling steps can be decreased. Further, compared with the conventional parts in which a magnetic element is respectively mounted, manufacturing cost can be reduced due to using a single common package for a plurality of magnetic element.

BRIEF DESCRIPTION OF THE DRAWING

The invention will be more readily understood with reference to the accompanying drawing, wherein.

DESCRIPTION OF THE INVENTION

Figure 1:
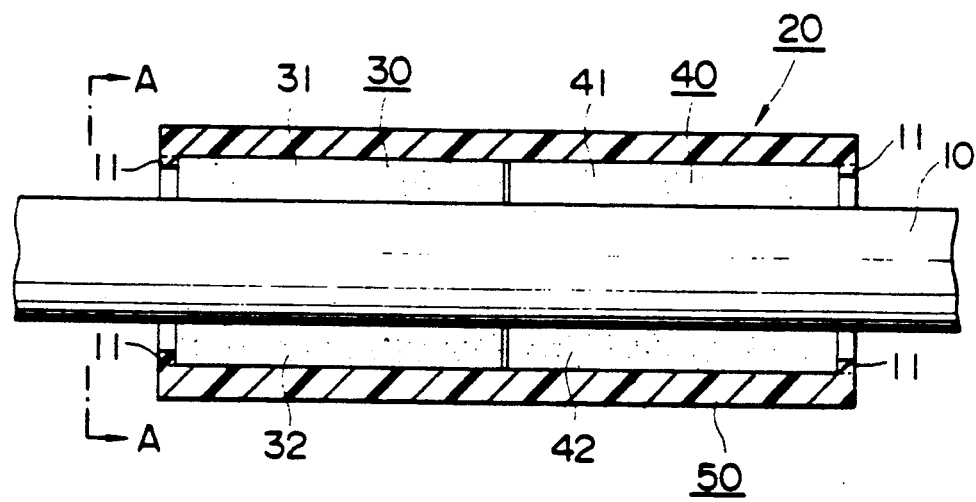
FIG. 1 shows a cross-sectional side view of the electric parts of the present invention installed on a signal line.
Figure 2:
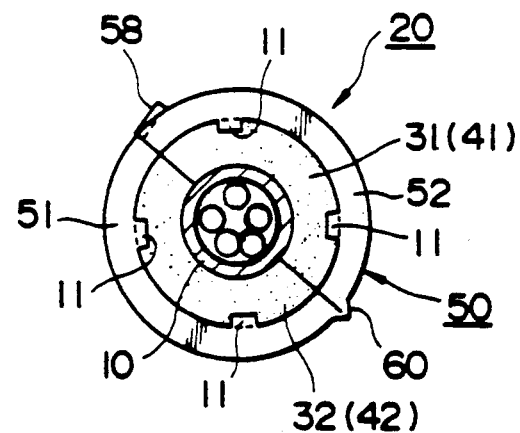
FIG. 2 shows a sectional view along a line A—A in FIG. 1.
Figure 3:
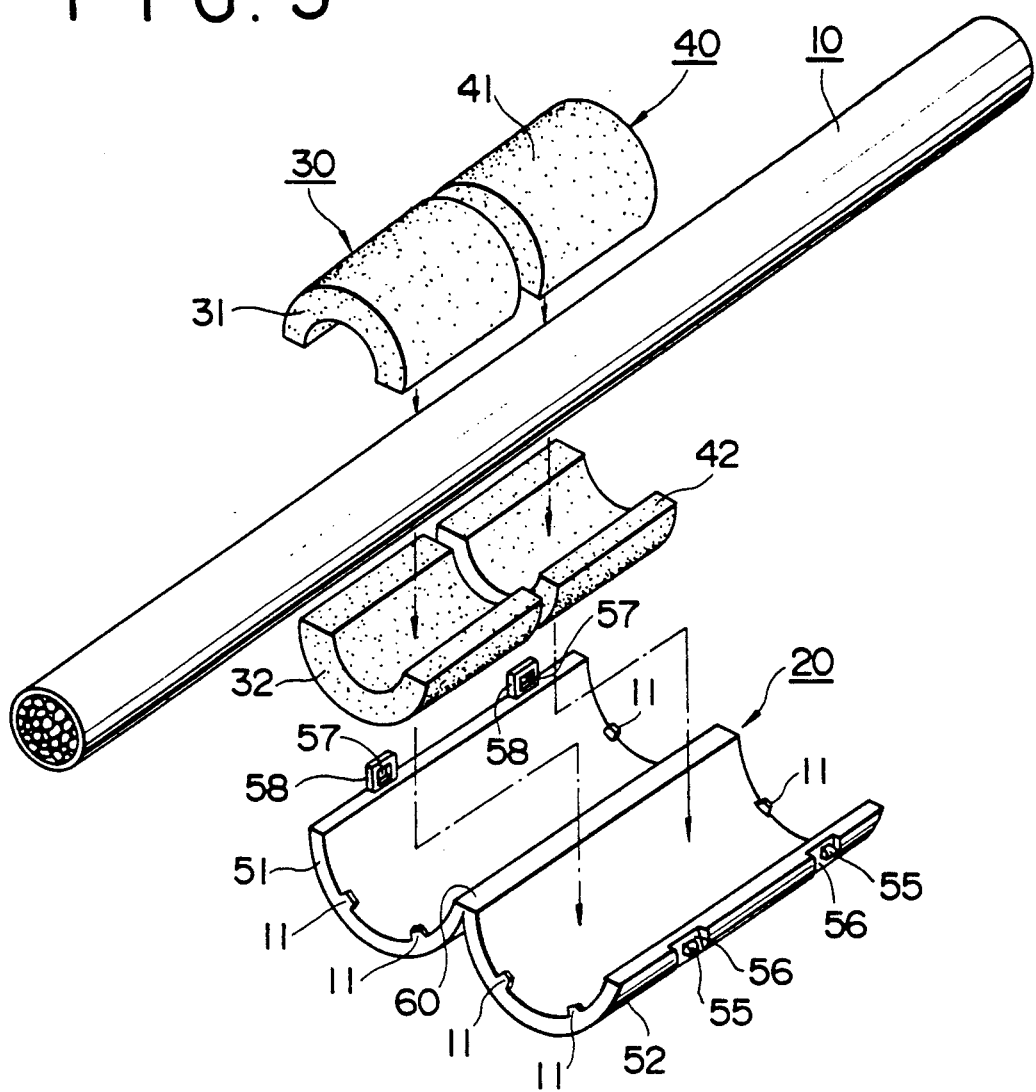
FIG. 3 shows an exploded perspective view of the electric parts of FIGS. 1 and 2.

Referring now to FIGS. 1, 2 and 3, a shielding part 20 is mounted around an outer surface of a signal line 10 (wire, cable, etc). The part 20 includes a first magnetic element 30, a second magnetic element 40 and a package 50. In more detail, the first and second magnetic element 30 and 40 are made of tubular ferrite cores. The magnetic elements 30 and 40 respectively have differing characteristic to absorb noise in two frequency bands which are different from each other. The magnetic elements 30 and 40 are respectively divided laterally into two semi-cylindrical portions 31 and 32 of the first magnetic element 30 and two semi-cylindrical portions 41 and 42 of the second magnetic element 40. When the divided surfaces are put together with the signal line 10 inserted therebetween, each half 31, 32, 33 and 34 of the first and second magnetic element is combined as a series of two tubes.

The package 50 is preferably made of a plastic material and formed also as a tube. The inner diameter of the package 50 is approximately equal to the outer diameter of the first and second magnetic elements 30 and 40. The lateral length of package 50 is slightly larger than the total length of the first and second magnetic element 30 and 40 so they can fit inside the package 50. The package 50 is also laterally divided into two. The package halves 51 and 52 are connected to each other by a hinge portion 60 which is preferably formed integrally as a thinner portion. The package halves 51 and 52 can be shut and open by rotating the package halves around the hinge portion 60 as an axis. From the outer edge surface of the package half 51, there is a pair of latches 58 extended with respective holes 57. The outer edge of the other half 51 has a pair of recessed portion 56 aligned with the pair of latches 58. In each recessed portions 56, a small hook 55 is formed. These hooks 55 engage the holes 57 when the package halves 51 and 52 are closed. At the lateral edge surfaces of each package half 51 and 52, a plurality of small projections 11 are formed which project toward the inside of the package when closed.

Next, the steps for assembling this shielding part 20 onto the signal line 20 will be explained. When the package 50 is open as shown in FIG. 3, the first and second magnetic element halves 32 and 42 are inserted inside the package half 52 with their open edges facing upward. At that time, the lateral edges of the first and second magnetic element halves 32 and 42 contact the small projections 11 limiting the lateral movement of halves 32 and 42. Then the signal line 10 is placed onto the halves 32 and 42. The other halves of the first and second magnetic element 31 and 41 are next mounted on the first and second halves 32 and 42 with the signal line 10 between them.

After that, the other half 51 of package 50 is rotated around the outer surface of the first and second magnetic element halves 31 and 41. When the rotation of package half 51 is at 180 degrees, first and second magnetic elements 30 and 40 surround the signal line 10 and are covered by the package 20. At this time, the pair of latches 58 at the open edge surface engage the recessed portions 56. At the end of rotation, the pair of hooks 56 engages firmly into the holes 57. The assembling steps are completed at this stage. The part for shielding 20 now surrounds the signal line 10.

Figure 4:
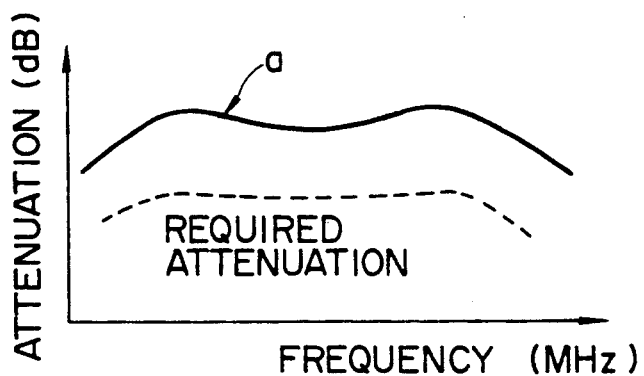
FIG. 4 shows the relationship between frequency and noise attenuation of the electric parts of the present invention.
Figure 5:
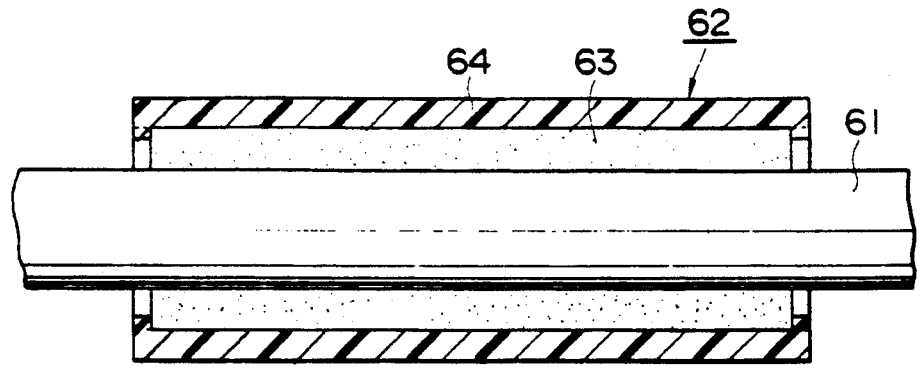
FIG. 5 shows a cross-sectional side view of a conventional electric shield part.
Figure 6:
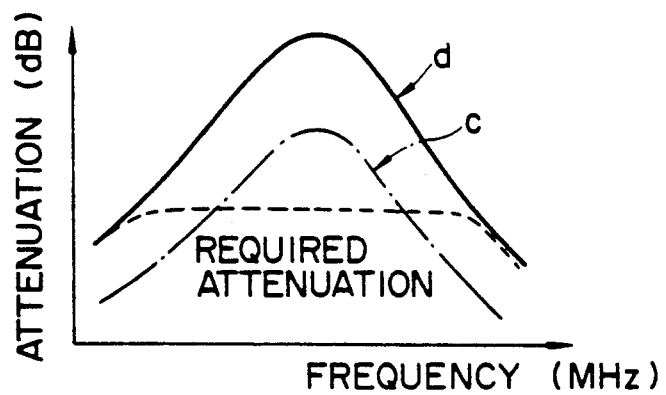
FIG. 6 shows the relationship between frequency and noise attenuation of one and two conventional electric parts with a single type of magnetic element.
Figure 7:
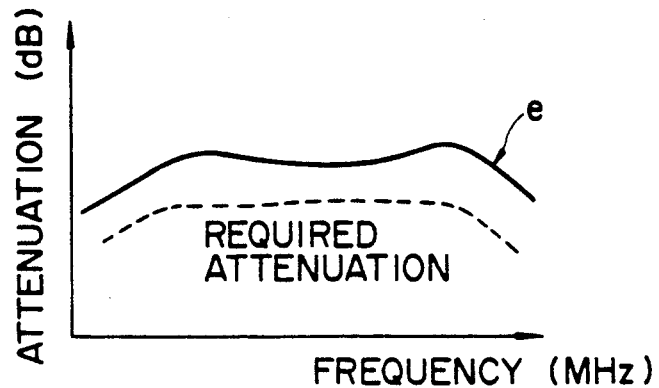
FIG. 7 shows the relationship between frequency and noise attenuation of two electric parts respectively with two magnetic elements having different characteristic.

Using this shielding structure, the signal line 10 is covered by the shielding part 20 which is made of two different magnetic elements 30 and 40 having different characteristics mounted inside the package 50. With this invention, noise can be absorbed over a wider range of frequency while only using a single part. FIG. 4 shows noise attenuation versus frequency for the above embodiment based on measured values. The absolute level of attenuation is approximately the same as that described in conjunction with FIG. 7 while achieving the advantages of the present invention. In this FIG. 4, a characteristic curve is illustrated by a solid curve (a). As shown in the drawing, in accordance with the structure described as an embodiment of the present invention, noise can be attenuated over a wide frequency range.

Since different kinds of magnetic elements 30 and 40 are mounted in a common package 50, they can be installed in a single operation rather than being mounted individually. The total number of assembly steps, therefore, can be decreased. The total cost can be also reduced by this single package 50 carrying different kinds of magnetic elements 30 and 40, compared with a conventional structure which requires independent shielding parts.

While specific embodiments of the invention have been shown and disclosed, it is to be understood that numerous changes and modifications may be made by those skilled in the art without departing from the scope and intent of the invention. For example, though the above embodiment is described with two different characteristics of magnetic element 30 and 40, more than two magnetic elements can be mounted into a common package. Also, although the use of plural characteristics is preferred, materials with the same characteristics could be used to increase attenuation over a narrow band. Although installation as described is preferred, those skilled in the art will understand that an electrical line could also be threaded through a fully assembled package. Other packaging could also be used to hold multiple shields without departing from the present invention. Similarly, there is no requirement that magnetic elements 30 and 40 be cylindrical since similar shapes are also suitable. Further, magnetic elements other than ferrite would be also applicable.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. An apparatus for shielding electromagnetic noise for use in conjunction with a signal line, comprising:
    at least two magnetic elements which have respective characteristics to attenuate noise indifferent respective frequency bands; and
    a common package for holding said at least two magnetic elements in series to form a magnetic element structure, said structure further including a substantially straight channel extending therethrough wherein said signal line extends through said channel and has a substantially straight shape in said channel.

2. The apparatus according to claim 1, wherein said at least two magnetic elements are respectively divided in a lateral direction into two respective halves.

3. The apparatus according to claim 2, wherein said common package is also laterally divided into two halves with the divided halves connected to each other by a hinge portion.

4. A shielding apparatus for providing electromagnetic shielding to a wire carrying an electrical signal, the shielding apparatus comprising in combination:

first magnetic means, having a first passage for passing said wire therethrough, for attenuating electrical noise over a first particular frequency band;

second magnetic means, adjacent said first magnetic means and having a second passage for passing said wire therethrough, for attenuating electrical noise over a second particular frequency band; and packaging means, surrounding said first and second magnetic means, for holding said first and second magnetic means in fixed proximity to one another such that said first passage and said second passage form a substantially straight wire passageway extending through said first and second magnetic means wherein said wire passes through said wire passageway and said packaging means and has a substantially straight shape in said wire passageway and packaging means.

5. The apparatus of claim 4, wherein said first and second frequency bands are different frequency bands.

6. The apparatus of claim 4, wherein said first and second magnetic means comprise first and second cylindrical ferrite elements.

7. The apparatus of claim 6, wherein said first and second cylindrical ferrite elements are each comprised of two semi-cylindrical elements.

8. The apparatus of claim 7, wherein said packaging means comprises:
a pair of half-cylindrical package sections having a joined edge and two open edges;
a hinge portion joining said pair of package sections at said joined edge;
a pair of latches, each including a hole, situated at one of said open edges; and
a pair of recessed portions with hooks aligned with and engaging said latches when said half-cylindrical sections are rotated to a closed position to form said cylindrical shape.

9. The apparatus of claim 8, wherein said packaging means further comprises:
a plurality of projections situated at said open ends of said package sections and adjacent an end of each of said first and second ferrite elements, said plurality of projections toward a central area of said packaging means when in said closed position to retain said two semi-cylindrical elements of said first and second cylindrical ferrite elements within said packaging means.

10. The apparatus of claim 4, wherein said packaging means includes a pair of half-cylindrical package sections having a joined edge and two open edges with a hinge portion joining said pair of package sections at said joined edge.

11. The apparatus of claim 10, wherein said packaging means further comprises a latch situated at one of said open edges and a latch engaging means situated along the other of said open edges.

12. An apparatus for providing electromagnetic shielding, comprising in combination:
a wire for carrying an electrical signal;
first magneticl means, having a first passage with said wire passing through said first passage, for attenuating electrical noise over a first particular frequency band;
second magnetic means, adjacent said first magnetic means and having a second passage with said wire passing through said second passage, for attenuating electrical noise over a second particular frequency band; and
packaging means, surrounding said first and second magnetic means, for holding said first and second magnetic means in fixed proximity to one another such that said first passage and said second passage form a substantially straight wire passageway extending through said first and second magnetic means wherein said wire passes through said wire passageway and said packaging means and has a substantially straight shape in said wire passageway and said packaging means.

13. The apparatus of claim 12, wherein said first and second frequency bands are different frequency bands.

14. The apparatus of claim 12, wherein said first and second magnetic means comprise first and second cylindrical ferrite elements.

15. The apparatus of claim 14, wherein said first and second cylindrical ferrite elements are each comprised of two semi-cylindrical elements.

16. The apparatus of claim 15, wherein said packaging means comprises:
a pair of half-cylindrical package sections having a joined edge and two open edges;
a hinge portion joining said pair of package sections at said joined edge;
a pair of latches, each including a hole, situated at one of said open edges; and
a pair of recessed portions with hooks aligned with and engaging said latches when said half-cylindrical sections are rotated to a closed position to form said cylindrical shape.

17. The apparatus of claim 16, wherein said packaging means further comprises:
a plurality of projections situated at said open ends of said package sections and adjacent an end of each of said first and second ferrite elements, said plurality of projections toward a central area of said packaging means when in said closed position to retain said two semi-cylindrical elements of said first and second cylindrical ferrite elements within said packaging means.

18. The apparatus of claim 12, wherein said packaging means includes a pair of half-cylindrical package sections having a joined edge and two open edges with a hinge portion joining said pair of package sections at said joined edge.

19. The apparatus of claim 18, wherein said packaging means further comprises a latch situated at one of said open edges and a latch engaging means situated along the other of said said open edges.

20. An apparatus for providing electromagnetic shielding, comprising in combination:
a wire for carrying an electrical signal;
a first ferrite element, said first ferrite element being cylindrical in shape with a first central passage and having said wire passing though said first central passage, said first ferrite element having magnetic characteristics which provide attenuation of electrical noise over a first particular frequency band;
a second ferrite element situated adjacent said first ferrite element, said second ferrite element being cylindrical in shape with a second central passage, said second ferrite element having magnetic characteristics which provide attenuation of electrical noise over a second particular frequency band;
said first and second ferrite elements each having first and second ends with said first and second central passages extending from said first to said second end;

said first and said second ferrite elements each being comprised of first and second half-cylindrical portions which form said substantially completed cylindrical shape when combined:

a plastic package surrounding said first and second ferrite elements, for holding said first and second ferrite elements end to end in fixed proximity to one another, said plastic package being cylindrical in shape with size suitable for containing said first and second ferrite elements when placed end to end, said plastic package further comprising:

a pair of half-cylindrical package sections having a joined edge and two open edges;

a hinge portion joining said pair of package sections at said joined edge;

a pair of latches, each including a hole, situated at one of said open edges;

a pair or recessed portions with hooks aligned with and engaging said latches when said half-cylindrical sections are rotated to a closed position to form said cylindrical shape; and a plurality of projections situated at said open ends of said package sections and adjacent an end of each of said first and second ferrite elements, said plurality of projections projecting toward a central area of said plastic package when in said closed position to retain said first and second half-cylindrical portions of said first and second ferrite elements within said plastic package.

* * * * *